United States Patent
Park et al.

(10) Patent No.: US 8,704,350 B2
(45) Date of Patent: Apr. 22, 2014

(54) STACKED WAFER LEVEL PACKAGE AND METHOD OF MANUFACTURING THE SAME

(75) Inventors: Seung Wook Park, Suwon-si (KR); Young Do Kweon, Seoul (KR); Jin Gu Kim, Suwon-si (KR); Ju Pyo Hong, Suwon-si (KR); Hee Kon Lee, Hwaseong-si (KR); Hyung Jin Jeon, Gunpo-si (KR); Jing Li Yuan, Suwon-si (KR); Jong Yun Lee, Incheon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/458,454

(22) Filed: Jul. 13, 2009

(65) Prior Publication Data

US 2010/0117218 A1  May 13, 2010

(30) Foreign Application Priority Data

Nov. 13, 2008 (KR) ............... 10-2008-0112534
Dec. 15, 2008 (KR) ............... 10-2008-0127091

(51) Int. Cl.
*H01L 23/02* (2006.01)
*H01L 23/48* (2006.01)
*H01L 23/52* (2006.01)
*H01L 29/40* (2006.01)

(52) U.S. Cl.
USPC .......... 257/686; 257/678; 257/777; 257/737; 257/738; 257/780; 257/E23.021

(58) Field of Classification Search
USPC .............. 257/686, 737, 738, 777, 780, 678, 257/E23.021, E23.033, E23.068, E21.508, 257/E23.085, 67
See application file for complete search history.

(56) References Cited

U.S. PATENT DOCUMENTS

| | | | |
|---|---|---|---|
| 5,615,477 A | 4/1997 | Sweitzer | |
| 6,633,081 B2 * | 10/2003 | Sahara et al. | 257/738 |
| 6,800,506 B1 | 10/2004 | Lin et al. | |
| 6,815,254 B2 * | 11/2004 | Mistry et al. | 438/108 |
| 7,018,866 B2 | 3/2006 | Sugaya et al. | |
| 7,276,799 B2 * | 10/2007 | Lee et al. | 257/777 |
| 2004/0070064 A1 * | 4/2004 | Yamane et al. | 257/686 |
| 2004/0183192 A1 * | 9/2004 | Otsuka et al. | 257/734 |
| 2007/0042594 A1 * | 2/2007 | Wakabayashi et al. | 438/613 |

(Continued)

FOREIGN PATENT DOCUMENTS

| | | |
|---|---|---|
| JP | 2002-170921 | 6/2002 |
| JP | 2009044160 A * | 2/2009 |

(Continued)

OTHER PUBLICATIONS

Office Action mailed from the U.S. Patent and Trademark Office on Dec. 19, 2011 in the related U.S. Appl. No. 12/929,703.

(Continued)

*Primary Examiner* — Teresa M Arroyo

(57) ABSTRACT

The present invention relates to a stacked wafer level package and a method of manufacturing the same. The stacked wafer level package in accordance with the present invention can improve a misalignment problem generated in a stacking process by performing a semiconductor chip mounting process, a rearrangement wiring layer forming process, the stacking process and so on after previously bonding internal connection means for interconnection between stacked electronic components to a conductive layer for forming a rearrangement wiring layer, thereby improving reliability and yield and reducing manufacturing cost.

5 Claims, 11 Drawing Sheets

(56) References Cited

U.S. PATENT DOCUMENTS

| | | | |
|---|---|---|---|
| 2008/0017968 A1* | 1/2008 | Choi et al. | 257/686 |
| 2008/0136003 A1* | 6/2008 | Pendse | 257/686 |
| 2008/0157329 A1* | 7/2008 | Inoue | 257/686 |
| 2008/0169544 A1* | 7/2008 | Tanaka et al. | 257/686 |
| 2008/0284041 A1* | 11/2008 | Jang et al. | 257/774 |
| 2008/0315415 A1* | 12/2008 | Ino | 257/737 |
| 2009/0008765 A1* | 1/2009 | Yamano et al. | 257/690 |
| 2009/0020885 A1* | 1/2009 | Onodera | 257/777 |
| 2009/0039491 A1* | 2/2009 | Kim et al. | 257/686 |
| 2009/0091026 A1* | 4/2009 | Fan | 257/737 |
| 2009/0146315 A1* | 6/2009 | Shim et al. | 257/777 |
| 2009/0166832 A1* | 7/2009 | Dunne | 257/680 |
| 2009/0206464 A1* | 8/2009 | Chung et al. | 257/686 |

FOREIGN PATENT DOCUMENTS

| | | |
|---|---|---|
| KR | 10-2006-0063654 | 6/2006 |
| KR | 10-2007-0087765 | 8/2007 |
| KR | 10-2008-0002491 | 1/2008 |
| KR | 10-2008-0080735 | 9/2008 |
| KR | 10-0865125 | 10/2008 |

OTHER PUBLICATIONS

U.S. Appl. No. 12/929,703, filed Feb. 9, 2011, Seung Wook Park et al., Samsung Electro-Mechanics Co., Ltd.

Office Action mailed from the U.S. Patent and Trademark Office on Jun. 11, 2012 in the related U.S. Appl. No. 12/929,703.

Office Action issued by the Korean Patent Office on Jul. 29, 2010 in the related Korean patent application No. 10-2008-0127091.

Notice of Allowance issued by the Korean Patent Office on Oct. 14, 2010 in the related Korean patent application No. 10-2008-0112534.

Office Action mailed from the U.S. Patent and Trademark Office on Mar. 27, 2013 in the corresponding U.S. Appl. No. 12/929,703.

Notice of allowance mailed from the U.S. Patent and Trademark Office on Oct. 7, 2013 in the corresponding U.S. Appl. No. 12/929,703.

* cited by examiner

STACKED WAFER LEVEL PACKAGE AND METHOD OF MANUFACTURING THE SAME

CROSS-REFERENCE TO RELATED APPLICATIONS

This application claims the benefit of Korean Patent Application Nos. 10-2008-0112534, filed on Nov. 13, 2008, and 10-2008-0127091, filed on Dec. 15, 2008, in the Korean Intellectual Property Office, the disclosures of which are incorporated herein by reference.

BACKGROUND OF THE INVENTION

1. Field of the Invention

The present invention relates to a stacked wafer level package and a method of manufacturing the same, and more particularly, to a stacked wafer level package and a method of manufacturing the same capable of improving a misalignment problem generated in a stacking process by performing a semiconductor chip mounting process, a rearrangement wiring layer forming process, the stacking process and so on after previously bonding internal connection means for interconnection between stacked electronic components to a conductive layer for forming a rearrangement wiring layer.

2. Description of the Related Art

These days, the electronics industry has a tendency to manufacture products with light weight, small size, high speed, multiple functions, high performance and high reliability at low cost. A semiconductor package is one of important technologies to achieve the above-described objects in designing the products.

Since the semiconductor package, which is a technology to efficiently package devices used in electronic products, is important enough to affect performance of a semiconductor device and cost, performance and reliability of a final product, it has been developed in various forms.

A stacked chip package, one of the semiconductor packages, has an advantage of increasing capacity of the semiconductor package or minimizing a mounting area based on the capacity of the semiconductor package by stacking semiconductor chips to manufacture a single package.

A manufacturing method of the stacked chip package includes both a wafer fabrication process of manufacturing individual semiconductor chips and a package assembly process of separating the individual semiconductor chips from a wafer to assemble a semiconductor package as a final product.

Like this, since the conventional method of manufacturing the stacked chip package includes both the wafer fabrication process and the package assembly process, it causes increase in throughput until completing the final product and deterioration of reliability and increase in process costs due to complication of processes. Therefore, finally, since the product is manufactured at high cost, there are disadvantages such as deterioration of price competiveness and so on.

Accordingly, a stacked wafer level package, which is manufactured by including processes of forming a rearrangement wiring layer, stacking a dielectric layer and forming a via hole on a chip after mounting the chip on a substrate, is developed. That is, the stacked wafer level package can reduce manufacturing process, time and cost by performing both manufacture and packaging of the semiconductor chip on the wafer substrate.

However, in the stacked wafer level package, a contact failure between the chip and the rearrangement wiring layer, which is formed in the following process, can be caused by a difference of thermal expansion coefficient between the wafer substrate and the semiconductor chip or deformation of the wafer substrate such as deflection, which is generated by a thermal treatment process performed after mounting the chip. Also, many failures can be caused in the following processes performed after mounting the chip, for example, a layer stacking process, a via hole forming process and so on.

In addition, misalignment of the stacked chip can be caused by the deformation of the wafer substrate in a process of further stacking another chip on the chip.

Therefore, the conventional stacked wafer level package technology capable of reducing manufacturing process and time has been developed but so far there have been problems such as reduction of yield and increase in cost due to misalignment generated in a stacking process.

SUMMARY OF THE INVENTION

The present invention has been proposed in order to solve the above-described problems, and it is, therefore, an object of the present invention to improve a misalignment problem generated in a stacking process by performing a semiconductor chip mounting process, a rearrangement wiring layer forming process, the stacking process and so on after previously bonding internal connection means for interconnection between stacked components to a conductive layer for forming a rearrangement wiring layer.

In accordance with an aspect of the present invention to achieve the object, there is provided a stacked wafer level package including a rearrangement wiring layer; external connection means disposed on a bottom of the rearrangement wiring layer and electrically connected to the rearrangement wiring layer; chip connection pads disposed on a top of the rearrangement wiring layer and electrically connected to the rearrangement wiring layer; a semiconductor chip mounted on the rearrangement wiring layer and connected to the chip connection pads; internal connection means electrically connected to the rearrangement wiring layer; a sealing member to seal the semiconductor chip while exposing portions of the internal connection means; and an electronic component stacked on the sealing member and electrically connected to the exposed internal connection means.

Here, the internal connection means may include internal connection pads electrically connected to the rearrangement wiring layer and solder balls connected to the internal connection pads.

Also, the internal connection means may include metal posts electrically connected to the rearrangement wiring layer.

Also, the electronic component has a shape of one of a semiconductor chip, a module and a package.

Also, the stacked wafer level package may further include a buffer unit to cover at least connection portions between the chip connection pads and the semiconductor chip.

Also, the stacked wafer level package may further include a stacked buffer unit filled between the electronic component and the sealing member.

Also, the external connection means may be one of metal bumps and solder balls.

Also, a mounting means of the semiconductor chip may use one of soldering, conductive paste, NCP (Non-Conductive Paste) and ACF (Anisotropic Conductive Film).

In accordance with another aspect of the present invention to achieve the object, there is provided a stacked wafer level package including a rearrangement wiring layer; external connection means disposed on a bottom of the rearrangement wiring layer and electrically connected to the rearrangement wiring layer; chip connection pads and internal connection pads disposed on a top of the rearrangement wiring layer and electrically connected to the rearrangement wiring layer; a semiconductor chip mounted on the rearrangement wiring layer and connected to the chip connection pads; solder balls connected to the internal connection pads; a sealing member to seal the semiconductor chip while exposing portions of the solder balls; and an electronic component stacked on the sealing member and electrically connected to the exposed solder balls.

In accordance with still another aspect of the present invention to achieve the object, there is provided a stacked wafer level package including a rearrangement wiring layer; external connection means disposed on a bottom of the rearrangement wiring layer and electrically connected to the rearrangement wiring layer; chip connection pads disposed on a top of the rearrangement wiring layer and electrically connected to the rearrangement wiring layer; a semiconductor chip mounted on the rearrangement wiring layer and connected to the chip connection pads; metal posts electrically connected to the rearrangement wiring layer; a sealing member to seal the semiconductor chip while exposing portions of the metal posts; and an electronic component stacked on the sealing member and electrically connected to the exposed metal posts.

In accordance with still another aspect of the present invention to achieve the object, there is provided a method of manufacturing a stacked wafer level package including the steps of preparing a substrate; forming a conductive layer on the substrate; forming chip connection pads and internal connection pads on the conductive layer; forming solder balls connected to the internal connection pads; mounting a semiconductor chip on the conductive layer to be connected to the chip connection pads; forming a sealing member to seal the solder balls and the semiconductor chip; separating the substrate from the conductive layer; forming a rearrangement wiring layer by etching the conductive layer; forming external connection means on the rearrangement wiring layer; forming contact holes in the sealing member to expose the solder balls; and stacking an electronic component to be electrically connected to the solder balls exposed through the contact holes.

Here, the connection between the semiconductor chip and the chip connection pads may use one of soldering, conductive paste, NCP and ACF.

Also, the method may further include the step of forming a buffer unit to cover at least connection portions between the chip connection pads and the semiconductor chip.

Also, the method may further include the step of forming a stacked buffer unit to surround at least connection portions between the solder balls and the electronic component.

Also, the substrate further includes a sacrificial layer on a top surface thereof, and the separation of the substrate from the conductive layer can be performed by removing the sacrificial layer.

Also, the sacrificial layer may be made of one of metal, silicon oxide, silicon nitride and UV photodegradable resin.

Also, the sacrificial layer can be removed by a wet etching method or UV irradiation.

Also, the separation of the substrate from the conductive layer can be performed by removing the substrate by a polishing method or a wet etching method.

In accordance with still another aspect of the present invention to achieve the object, there is provided a method of manufacturing a stacked wafer level package including the steps of preparing a substrate; forming a conductive layer on the substrate; forming chip connection pads and internal connection pads on the conductive layer; forming solder balls connected to the internal connection pads; mounting a semiconductor chip to be connected to the chip connection pads; forming a sealing member to seal the semiconductor chip while exposing the solder balls; separating the substrate from the conductive layer; forming a rearrangement wiring layer by etching the conductive layer; forming external connection means on the rearrangement wiring layer; and stacking an electronic component on the sealing member to be electrically connected to the solder balls.

Here, the method may further include the step of forming a stacked buffer layer to surround at least connection portions between the solder balls and the electronic component.

Also, the stacked buffer unit may be formed on an entire surface between the electronic component and the sealing member.

In accordance with still another aspect of the present invention to achieve the object, there is provided a method of manufacturing a stacked wafer level package including the steps of preparing a substrate; forming a conductive layer on the substrate; forming metal posts electrically connected to the conductive layer; forming chip connection pads on the conductive layer; mounting a semiconductor chip on the conductive layer to be connected to the chip connection pads; forming a sealing member to seal the metal posts and the semiconductor chip; separating the substrate from the conductive layer; forming a rearrangement wiring layer by etching the conductive layer; forming external connection means on the rearrangement wiring layer; and stacking an electronic component on the sealing member to be electrically connected to the metal posts.

Here, the connection between the semiconductor chip and the chip connection pads may use one of soldering, conductive paste, NCP and ACF.

Also, the method may further include the step of forming a buffer unit to cover at least connection portions between the chip connection pads and the semiconductor chip.

Also, the method may further include the step of forming a stacked buffer unit to surround at least connection portions between the metal posts and the electronic component.

Also, after the step of forming the external connection means on the rearrangement wiring layer, the method may further include the steps of forming contact holes in the sealing member to expose the metal posts; and filling the contact holes with connection members.

Also, in the step of forming the sealing member, the sealing member may be formed to expose the metal posts.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
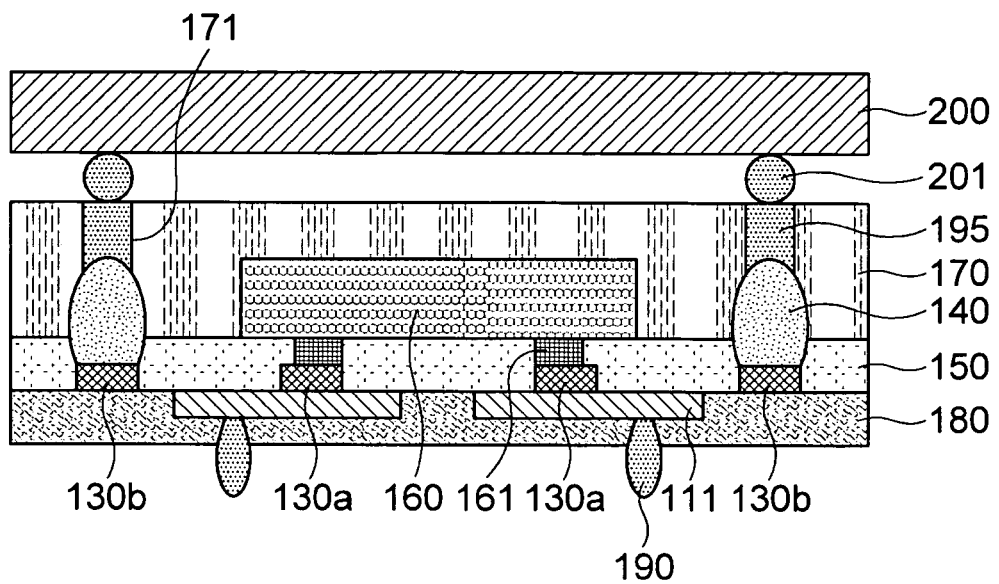
FIG. 1 is a cross-sectional view of a stacked wafer level package in accordance with a first embodiment of the present invention.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

FIG. 1 is a cross-sectional view of a stacked wafer level package in accordance with an embodiment of the present invention.

Referring to FIG. 1, the stacked wafer level package in accordance with the embodiment of the present invention includes a rearrangement wiring layer 111, external connection means 190, chip connection pads 130a, a semiconductor chip 160, internal connection means 130b and 140, a sealing member 170 and an electronic component 200.

The rearrangement wiring layer 111 plays a role in rearranging the chip connection pads 130a and internal connection pads 130b described later.

An insulating pattern 180 is disposed on a bottom of the rearrangement wiring layer 111. The insulating pattern 180 plays a role in protecting the rearrangement wiring layer 111 from the outside.

The insulating pattern 180 exposes portions of the rearrangement wiring layer 111. The external connection means 190 are bonded to the bottom of the exposed rearrangement wiring layer 111. That is, the external connection means 190 are electrically connected to the rearrangement wiring layer 111. The stacked wafer level package can be electrically connected to an external signal device such as a printed circuit board by the external connection means 190. The external connection means 190 may be solder balls or metal bumps.

The chip connection pads 130a and the internal connection means 130b and 140 can be disposed on a top of the rearrangement wiring layer 111. Here, the internal connection means 130b and 140 may include the internal connection pads 130b and solder balls 140. At this time, the chip connection pads 130a and the internal connection pads 130b may be electrically connected to the rearrangement wiring layer 111. Accordingly, the chip connection pads 130a and the internal connection pads 130b can be rearranged by the rearrangement wiring layer 111. The chip connection pads 130a and the internal connection pads 130b may be electrically connected to or separated from each other.

The semiconductor chip 160 may include connection terminals 161 formed of solder balls or metal bumps. The connection terminals 161 of the semiconductor chip 160 are electrically connected to the chip connection pads 130a. Therefore, the semiconductor chip 160 can be mounted on the rearrangement wiring layer 111. Here, a mounting means 150 of the semiconductor chip 160 may be soldering, conductive paste, NCP (Non-Conductive Paste), ACF (Anisotropic Conductive Film) or the like.

In addition, in case that the chip connection pads 130a and the semiconductor chip 160 are electrically connected to each other by soldering, although it is not shown in the drawing, the stacked wafer level package in accordance with the embodiment of the present invention may further include a buffer unit to cover at least connection portions between the chip connection pads 130a and the semiconductor chip 160. The buffer unit may be disposed on an entire surface between the semiconductor chip 160 and the insulating pattern 180 including the rearrangement wiring layer 111. The buffer unit may be made of under-fill material. The buffer unit plays a role in improving reliability of electrical connection between the semiconductor chip 160 and the chip connection pads 130a by performing an electrical insulation function and a buffer function to absorb and release thermal stress. Also, the buffer unit can play a role in bonding and fixing the semiconductor chip 160 to the insulating pattern 180 including the rearrangement wiring layer 111.

The solder balls 140 are directly bonded to the internal connection pads 130b. Here, the rearrangement wiring layer 111 and the electronic component 200 described later can be electrically connected to each other by the internal connection pads 130b.

The sealing member 170 plays a role in protecting the semiconductor chip 160 from an external environment by sealing the semiconductor chip 160. Here, the sealing member 170 exposes portions of the solder balls 140 for electrical connection between the solder balls 140 and the electronic component 200. At this time, the sealing member 170 may include contact holes 171 to expose the solder balls 140 of the internal connection means 130b and 140.

The electronic component 200, which is electrically connected to the solder balls 140 exposed by the contact holes 171, is stacked. Here, the solder balls 140 and connection terminals 201 of the electronic component 200 can be electrically connected to each other by connection members 195 filled in the contact holes 171, for example, a plating layer and conductive paste. Therefore, the electronic component 200 can receive electrical signals from the outside through the solder balls 140.

The electronic component 200 may be an additional semiconductor chip, a module, a package or the like. Here, the additional semiconductor chip may be the same or different kind as the semiconductor chip 160 and is not limited in the embodiment of the present invention. Also, the connection terminals 201 of the electronic component 200 may be solder balls, metal bumps or the like.

In addition, although it is not shown in the drawing, the stacked wafer level package in accordance with the embodiment of the present invention may further include a stacked buffer unit to surround at least connection portions between the solder balls 140 and the electronic component 200. That is, the stacked buffer unit is interposed between the sealing member 170 and the electronic component 200. Here, the stacked buffer unit can improve reliability of electrical connection by releasing thermal stress of the solder balls 140. Also, the stacked buffer unit plays a role in fixing the electronic component 200 to the sealing member 170.

Therefore, in the embodiment of the present invention, the reliability of electrical connection between the stacked electronic components can be secured by achieving interconnection between the stacked electronic components through the solder balls as the internal connection means electrically connected to the rearrangement wiring layer.

Hereinafter, a stacked wafer level package in accordance with a second embodiment of the present invention will be described in detail with reference to FIG. 2. In the second embodiment of the present invention, the stacked wafer level package has the same elements as those of the first embodiment except a stacked buffer unit. Therefore, the same reference numerals are given to the same elements as those of the first embodiment, and repeated descriptions will be omitted.

Figure 2:
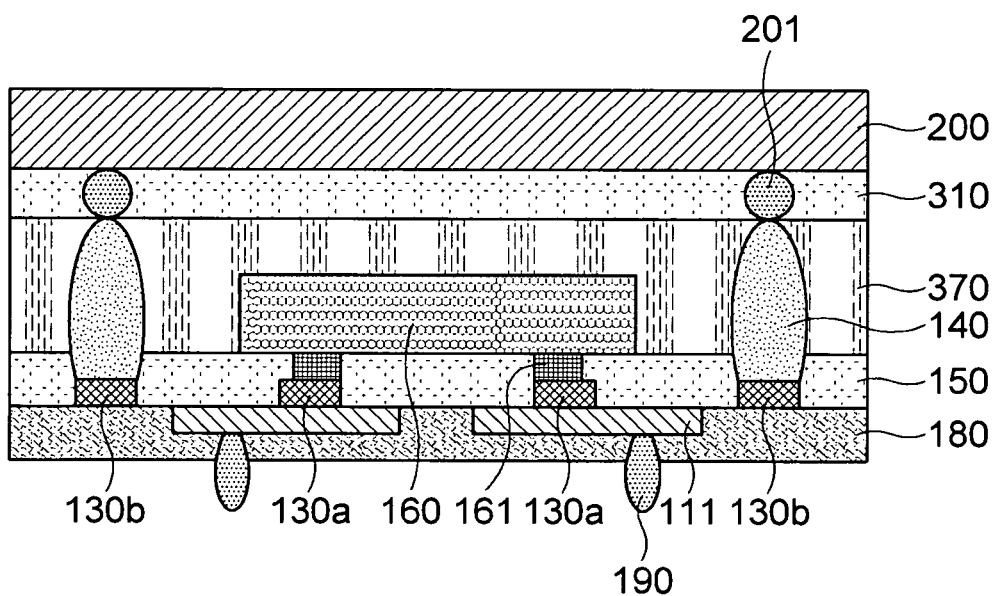
FIG. 2 is a cross-sectional view of a stacked wafer level package in accordance with a second embodiment of the present invention.

FIG. 2 is a cross-sectional view of the stacked wafer level package in accordance with the second embodiment of the present invention.

Referring to FIG. 2, the stacked wafer level package in accordance with the embodiment of the present invention includes a rearrangement wiring layer 111, an insulating pattern 180 disposed on a bottom of the rearrangement wiring layer 111 to expose portions of the rearrangement wiring layer 111, external connection means 190 electrically bonded to the bottom of the exposed rearrangement wiring layer 111, chip connection pads 130a electrically connected to the rearrangement wiring layer 111, a semiconductor chip 160 mounted on the rearrangement wiring layer 111 to be electrically connected to the chip connection pads 130a, internal connection means 130b and 140 electrically connected to the rearrangement wiring layer 111, a sealing member 370 to seal the semiconductor chip 160 while exposing portions of the internal connection means 130b and 140, and an electronic component 200 stacked on the sealing member 370 to be electrically connected to the exposed internal connection means 130b and 140.

Here, the internal connection means 130b and 140 may include internal connection pads 130b and solder balls 140 electrically connected to the internal connection pads 130b.

At this time, since the sealing member 370 has a height at least equal to or lower than that of the solder balls 140, the solder balls 140 can be exposed from the sealing member 370. Here, in order to electrically connect the electronic component 200 to the solder balls 140, connection terminals 201 of the electronic component 200 and the solder balls 140 can be directly bonded to each other. Accordingly, the electronic component 200 can be electrically connected to the rearrangement wiring layer 111 through the solder balls 140.

The stacked wafer level package may further include a stacked buffer unit 310 filled between the electronic component 200 and the sealing member 370. The stacked buffer unit 310 may be made of under-fill material. Here, the stacked buffer unit 310 plays a role in improving reliability of electrical contact between the electronic component 200 and the solder balls 140. Here, although it is shown that the stacked buffer unit 310 is filled on an entire surface between the electronic component 200 and the sealing member 360, it is not limited thereto. For example, the stacked buffer unit 310 can be formed to surround only connection portions between the solder balls 140 and the electronic component 200.

In the embodiment of the present invention, although it is shown that the electronic component 200 is stacked by being directly bonded to the solder balls 140, it is not limited thereto, and ACF and NCP can be used.

Therefore, the stacked wafer level package in accordance with the embodiment of the present invention can electrically connect the solder balls and the electronic component through a simple process since the sealing member has a height equal to or lower than that of the solder balls for connection of the stacked electronic component.

Also, the stacked wafer level package can improve electrical reliability between the stacked electronic components by having the stacked buffer unit in the connection portions between the solder balls and the electronic component.

Hereinafter, a stacked wafer level package in accordance with a third embodiment of the present invention will be described in detail with reference to FIG. 3. In the third embodiment of the present invention, the stacked wafer level package has the same elements as those of the first embodiment except internal connection means. Therefore, the same reference numerals are given to the same elements as those of the first embodiment, and repeated descriptions will be omitted.

Figure 3:
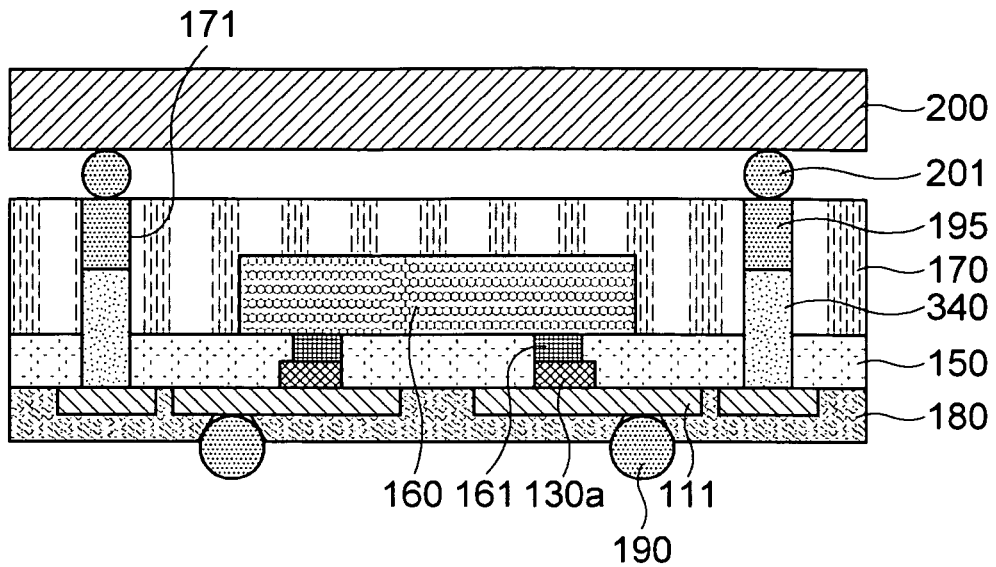
FIG. 3 is a cross-sectional view of a stacked wafer level package in accordance with a third embodiment of the present invention.

FIG. 3 is a cross-sectional view of the stacked wafer level package in accordance with the third embodiment of the present invention.

Referring to FIG. 3, the stacked wafer level package in accordance with the embodiment of the present invention includes a rearrangement wiring layer 111, an insulating pattern 180 disposed on a bottom of the rearrangement wiring layer 111 to expose portions of the rearrangement wiring layer 111, external connection means 190 electrically bonded to the bottom of the exposed rearrangement wiring layer 111, chip connection pads 130a electrically connected to the rearrangement wiring layer 111, a semiconductor chip 160 mounted on the rearrangement wiring layer 111 to be electrically connected to the chip connection pads 130a, internal connection pads 340 electrically connected to the rearrangement wiring layer 111, a sealing member 370 to seal the semiconductor chip 160 while exposing portions of the internal connection means 130b and 140, and an electronic component 200 stacked on the sealing member 370 to be electrically connected to the exposed internal connection means 340.

Here, the internal connection means 340 may be metal posts 340.

The rearrangement wiring layer 111 plays a role in rearranging the chip connection pads 130a and the metal posts 340.

The insulating pattern 180 is disposed on the bottom of the rearrangement wiring layer 111 to expose the portions of the rearrangement wiring layer 111. The external connection means 190 are bonded to the bottom of the exposed rearrangement wiring layer 111.

The chip connection pads 130a may be disposed on a top of the rearrangement wiring layer 111. Here, the chip connection pads 130a may be electrically connected to the rearrangement wiring layer 111. Accordingly, the chip connection pads 130a can be rearranged by the rearrangement wiring layer 111.

Connection terminals 161 of the semiconductor chip 160 are electrically connected to the chip connection pads 130a, and the semiconductor chip 160 can be mounted on the rearrangement wiring layer 111.

The metal posts 340 may be electrically connected to the rearrangement wiring layer 111. Here, the rearrangement wiring layer 111 and the electronic component 200 described later can be electrically connected to each other through the metal posts 340.

The sealing member 170 plays a role in protecting the semiconductor chip 160 from an external environment by sealing the semiconductor chip 160. Here, the sealing member 170 exposes portions of the metal posts 340 for electrical connection between the metal posts 340 and the electronic component 200. At this time, the sealing member 170 may include contact holes 171 to expose the metal posts 340.

The electronic component 200, which is electrically connected to the metal posts 340 exposed by the contact holes 171, is stacked. Here, the metal posts 140 and connection terminals 201 of the electronic component 200 can be electrically connected to each other through connection members 195 filled in the contact holes 171, for example, a plating layer and conductive paste. Therefore, the electronic component 200 can receive electrical signals from the outside through the metal posts 340.

In addition, although it is not shown in the drawing, the stacked wafer level package may further include a stacked buffer unit to surround at least connection portions between the metal posts 340 and the electronic component 200.

Therefore, the stacked wafer level package in accordance with the embodiment of the present invention can secure a fine pitch and reliability of electrical connection between the stacked electronic components by forming interconnection between the stacked electronic components through the internal connection means electrically connected to the rearrangement wiring layer, that is, the metal posts.

In addition, in the embodiment of the present invention, although it is shown that the sealing member has the contact holes to expose the metal posts, it is not limited thereto. That is, the metal posts can be exposed without separately forming the contact holes by adjusting a height of the sealing member. For example, in case of forming the sealing member at the height equal to or lower than that of the metal posts, the metal posts can be naturally exposed from the sealing member.

FIGS. 4 to 19 are cross-sectional views illustrating a manufacturing process of a stacked wafer level package in accordance with a fourth embodiment of the present invention.

Figure 4:
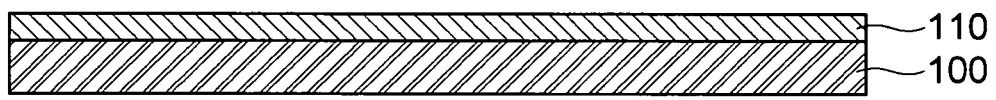
FIGS. 4 to 19 are cross-sectional views illustrating a manufacturing process of a stacked wafer level package in accordance with a fourth embodiment of the present invention.

Referring to FIG. 4, in order to manufacture the stacked wafer level package, first, a substrate 100 is prepared.

The substrate 100 may be a wafer substrate used in a semiconductor process. The substrate 100 may be made of silicon, ceramic, glass, polymer or the like.

A conductive layer 110 is formed on the substrate 100. Here, the conductive layer 110 can be formed by laminating a metal foil. In the embodiment of the present invention, a method of forming the conductive layer 110 is not limited, and the conductive layer 110 can be formed by other methods such as by depositing metal. Also, the metal may be Cu, Au, W, Ni, Pb, Ti or the like. The conductive layer 110 may be formed of a film of a single kind or stacked films of two or more kinds.

Figure 5:
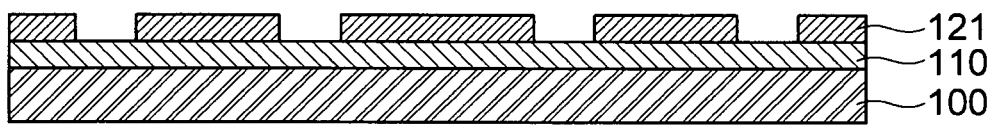

Referring to FIG. 5, after forming the conductive layer 110, a first resist pattern 121 is formed on the conductive layer 110. In order to form the first resist pattern 121, a resist layer is formed by firstly coating photosensitive resin or laminating DFR (Dry Film Resist) on the conductive layer 110. Then, the first resist pattern 121 is formed by performing exposure and development processes on the resist layer.

Figure 6:
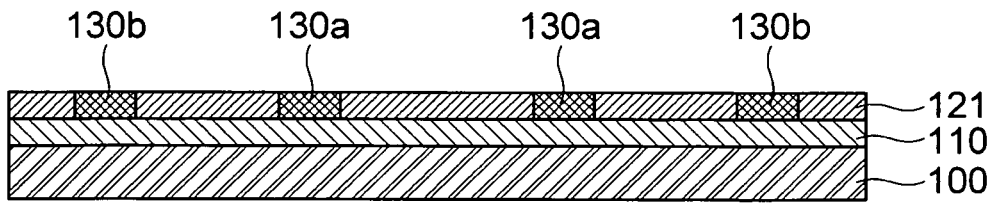

Referring to FIG. 6, chip connection pads 130*a* and internal connection pads 130*b* are formed on the conductive layer 110 exposed by the first resist pattern 121 by using the first resist pattern 121 as a mask.

The chip connection pads 130*a* and the internal connection pads 130*b* can be formed by a deposition process using a shadow mask. Or, the chip connection pads 130*a* and the internal connection pads 130*b* can be formed by electroplating using the conductive layer 110 as a seed layer.

The chip connection pads 130*a* and the internal connection pads 130*b* may be made of metal such as Al and Cu. Here, the chip connection pads 130*a* and the internal connection pads 130*b* may be made of the same conductive material.

Figure 7:
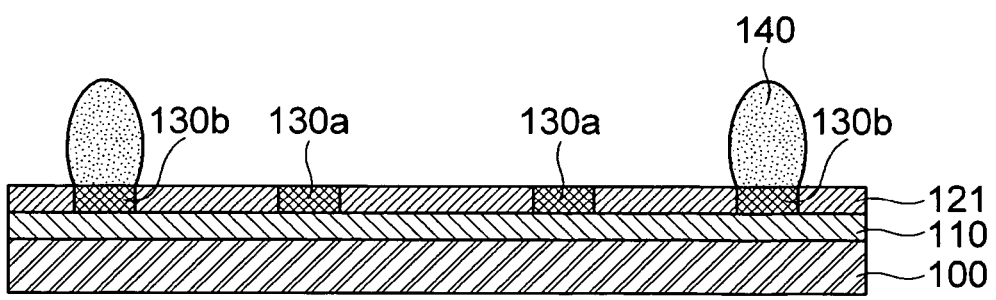

Referring to FIG. 7, solder balls 140 are bonded to be electrically connected to the internal connection pads 130*b*. The solder balls 140 can be formed by a reflow process after being disposed on the internal connection pads 130*b* by a method such as plating, ball placement, stencil printing or the like. Accordingly, the internal connection means 130*b* and 140 composed of the internal connection pads 130*b* and the solder balls 140 can be formed.

Figure 8:
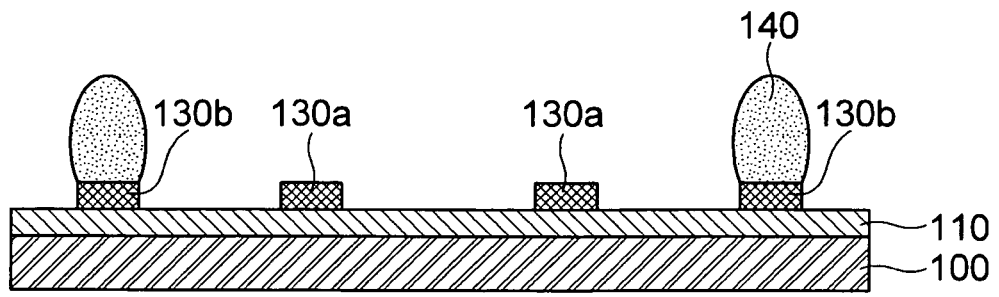

Then, as shown in FIG. 8, the first resist pattern 121 is removed. Here, an electrical failure generated when the solder balls 140 are bonded to other regions can be prevented by the first resist pattern 121.

Figure 9:
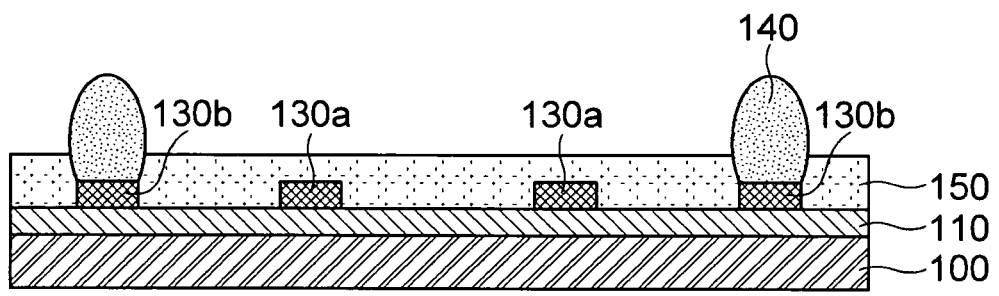

Referring to FIG. 9, after removing the first resist pattern 121, a mounting means 150 such as ACF, liquid NCP or the like is formed on the conductive layer 110 including the chip connection pads 130*a*.

Figure 10:
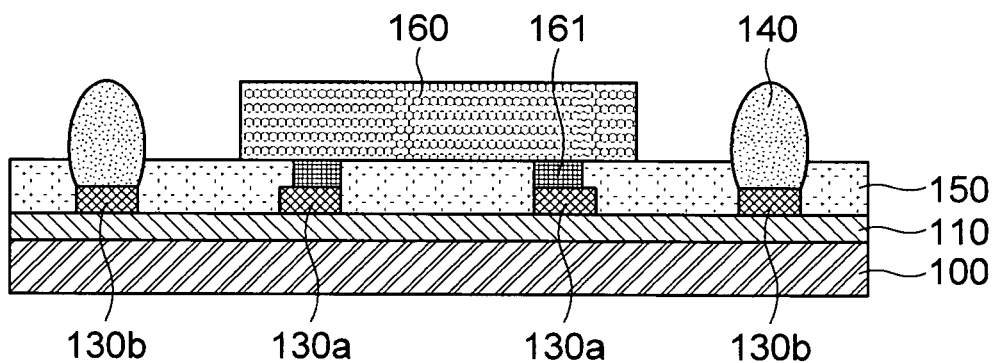

Referring to FIG. 10, as the semiconductor chip 160 is pressed onto the mounting means 150, connection terminals 161 of the semiconductor chip 160 can be electrically connected to the chip connection pads 130*a*. Here, in case that the mounting means 150 is ACF, the connection terminals 161 of the semiconductor chip 160 and the chip connection pads 130*a* can be electrically connected to each other. Also, in case that the mounting means 150 is NCP, the mounting means 150 bonds and fixes the semiconductor chip 160 to the conductive layer 110 by being disposed around the connection terminals 161 of the semiconductor chip 160 and the chip connection pads 130*a*, which are in contact with each other, without being interposed between the connection terminals 161 of the semiconductor chip 160 and the chip connection pads 130*a*. At this time, the NCP can play a role of a buffer unit to improve reliability of electrical contact between the semiconductor chip 160 and the conductive layer 110.

The semiconductor chip 160 and the chip connection pads 130*a* can be electrically connected to each other by using soldering or conductive paste as the mounting means 150. Here, in case that the semiconductor chip 160 and the chip connection pads 130*a* are electrically connected to each other by soldering, although it is not shown in the drawing, a buffer unit may be further formed to cover connection portions between the semiconductor chip 160 and the chip connection pads 130*a*. The buffer unit can improve fatigue life of solder by releasing thermal stress applied to the solder due to a difference of thermal expansion coefficient between the semiconductor chip 160 and the substrate 100. Accordingly, the reliability of electrical contact between the semiconductor chip 160 and the chip connection pads 130*a* can be improved. Also, the semiconductor chip 160 can be fixed to the conductive layer 110 by the buffer unit. The buffer unit may be formed by filling under-fill material between the conductive layer 110 and the semiconductor chip 160 after bonding the semiconductor chip 160 to the chip connection pads 130*a* by soldering. For example, the under-fill material may include epoxy resin, polyimide resin, polyacrylate resin, polyester resin, polybenzoxazole resin or the like.

Figure 11:
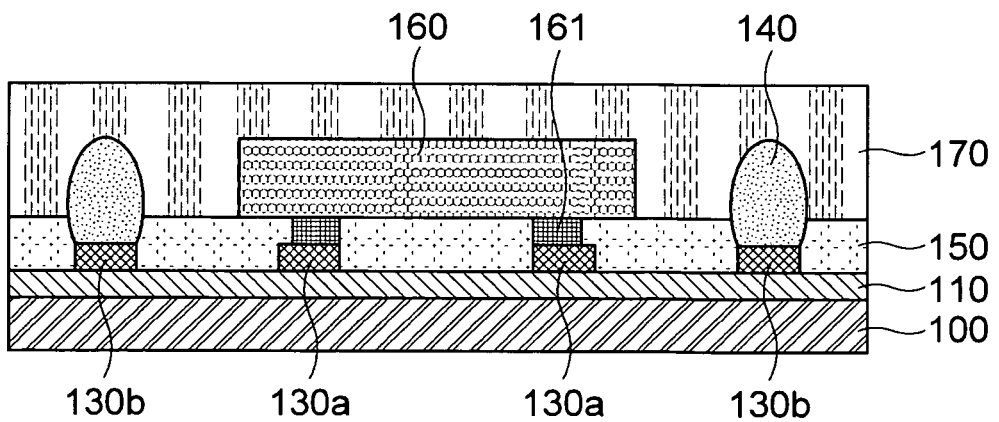

Referring to FIG. 11, after mounting the semiconductor chip 160, a sealing member 170 is formed to seal the semiconductor chip 160. Here, the sealing member 170 may be formed by a method such as transfer molding, injection molding, screen printing, dispensing or the like. Also, the sealing member 170 may be made of resin such as epoxy resin, silicon resin, fluorine resin, acrylic resin or the like.

Figure 12:
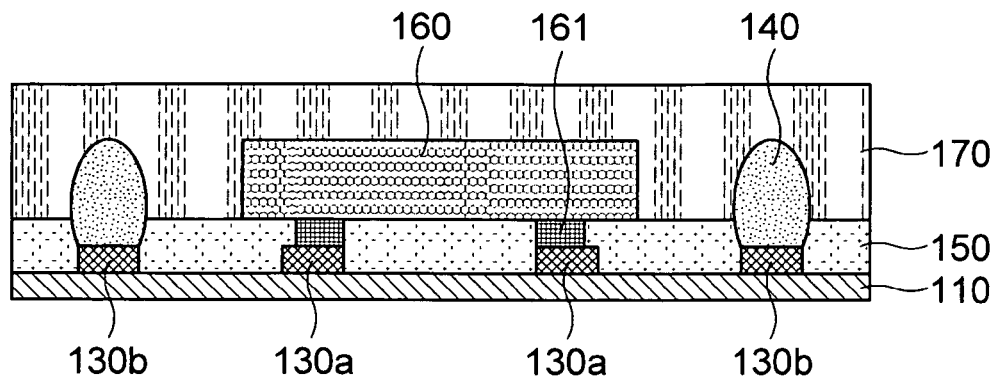

Referring to FIG. 12, after forming the sealing member 170, the substrate 100 is separated from the conductive layer 110. The substrate 100 can be separated from the conductive layer 110 by a polishing method or a wet etching method.

Although it is not shown in the drawing, the substrate 100 can be separated from the conductive layer 110 by other methods such as by removing a sacrificial layer through a wet etching method or UV irradiation after forming the sacrificial layer between the substrate 100 and the conductive layer 110. At this time, the sacrificial layer is formed on the substrate 100 before forming the conductive layer 110. Here, the sacrificial layer may be formed of one of metal, silicon oxide, silicon nitride and UV photodegradable resin.

Figure 13:
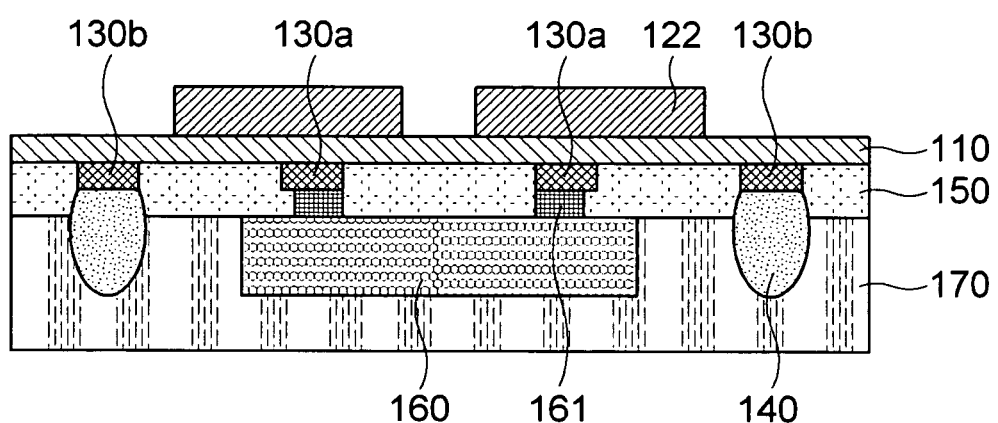

Referring to FIG. 13, a second resist pattern 122 is formed on a bottom of the conductive layer 110, which is exposed by removing the substrate 100. The second resist pattern 122 forms a resist layer by coating photosensitive resin or laminating DFR on the bottom of the conductive layer 110. Then, the second resist pattern 122 is formed by performing exposure and development processes on the resist layer.

Figure 14:
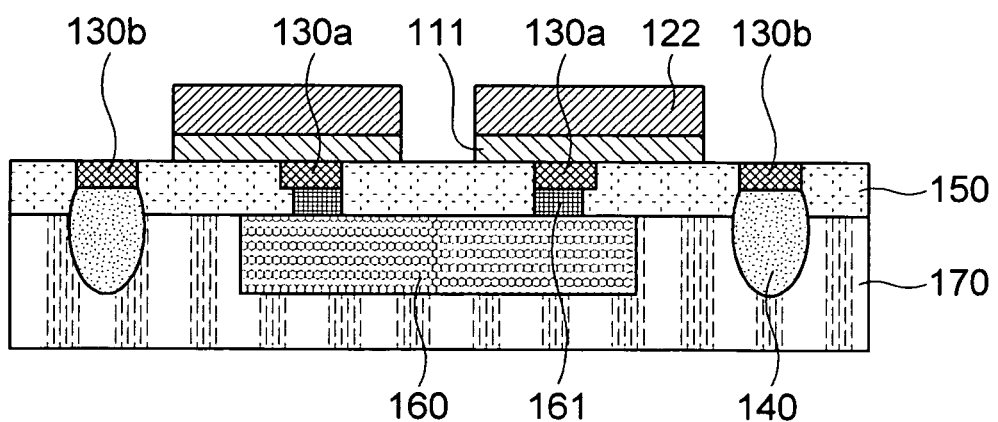
Figure 15:
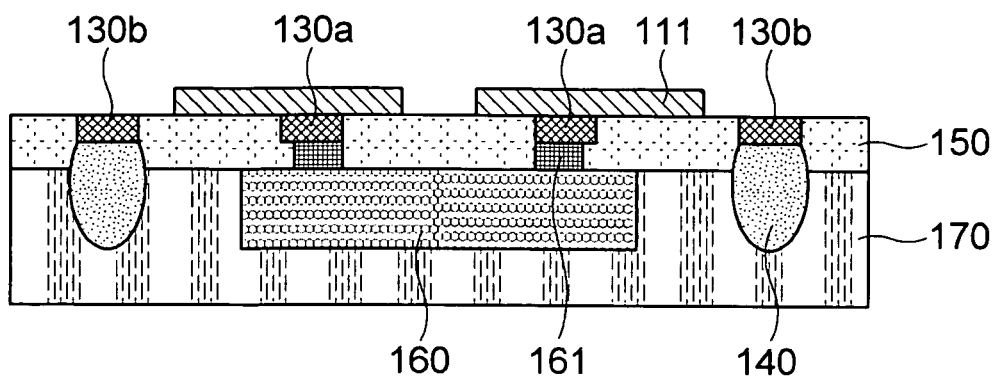

Referring to FIG. 14, a rearrangement wiring layer 111 is formed by etching the conductive layer 110 by using the second resist pattern 122 as an etch mask. Then, as shown in FIG. 15, the second resist pattern 122 is removed.

Therefore, as a rearrangement wiring layer forming process, a semiconductor chip mounting process, a sealing member forming process and so on are performed after previously bonding the solder balls 140 for interconnection with an electronic component 200 described later to the conductive layer 110 before forming the rearrangement wiring layer 111, a connection failure between the solder balls 140 and the rearrangement wiring layer 111 can be prevented.

Figure 16:
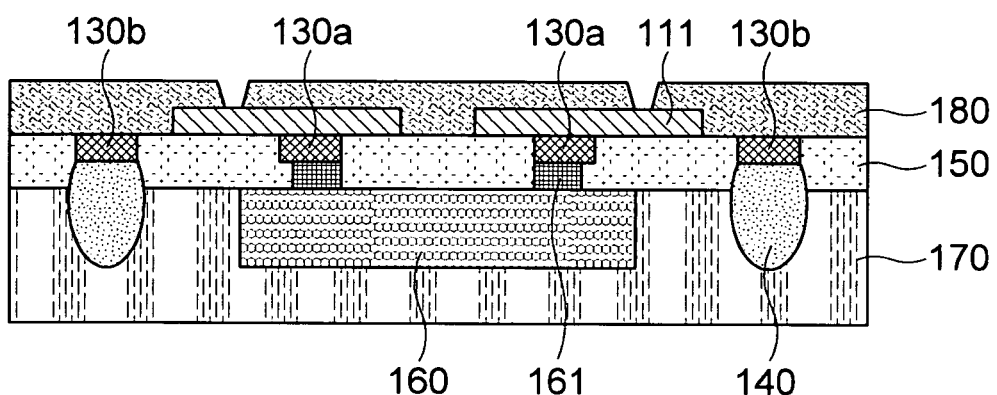

Referring to FIG. 16, an insulating pattern 180 is formed on the rearrangement wiring layer 111. The insulating pattern 180 exposes portions of the rearrangement wiring layer 111. The insulating pattern 180 can be formed by exposure and development processes after forming an insulating layer.

Figure 17:
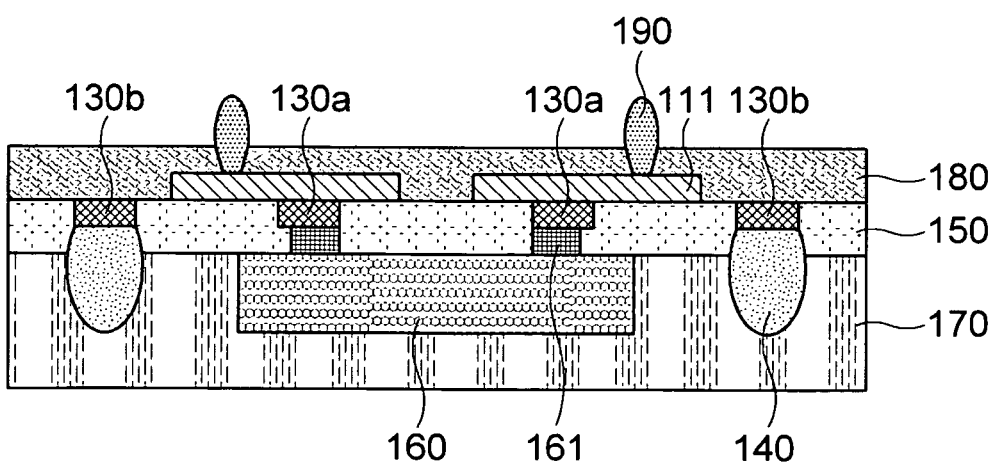

Referring to FIG. 17, external connection means 190 are formed on the rearrangement wiring layer 111 exposed by the insulating pattern 180. Here, the external connection means may be solder balls or metal bumps.

Figure 18:
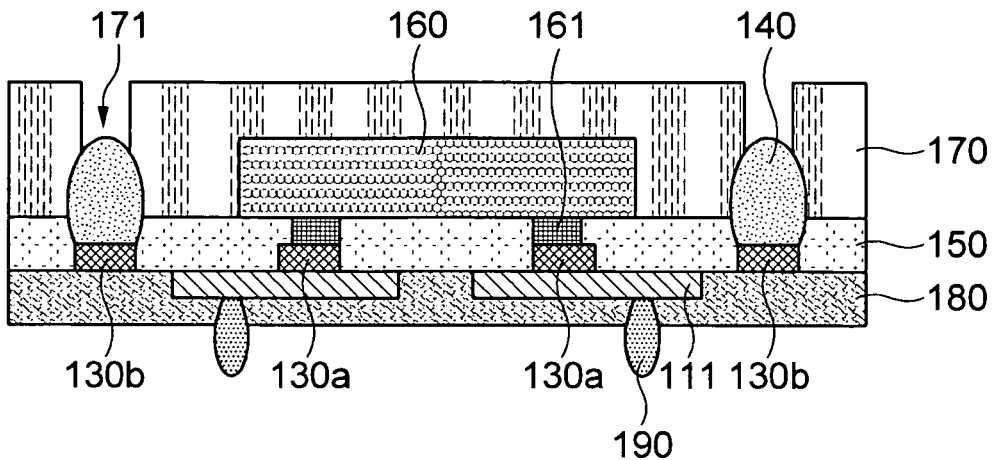

Referring to FIG. 18, contact holes 171 are formed in the sealing member 170 to expose the solder balls 140. The contact holes 171 can be formed by a method such as mechanical drilling, laser drilling, etching or the like.

Figure 19:
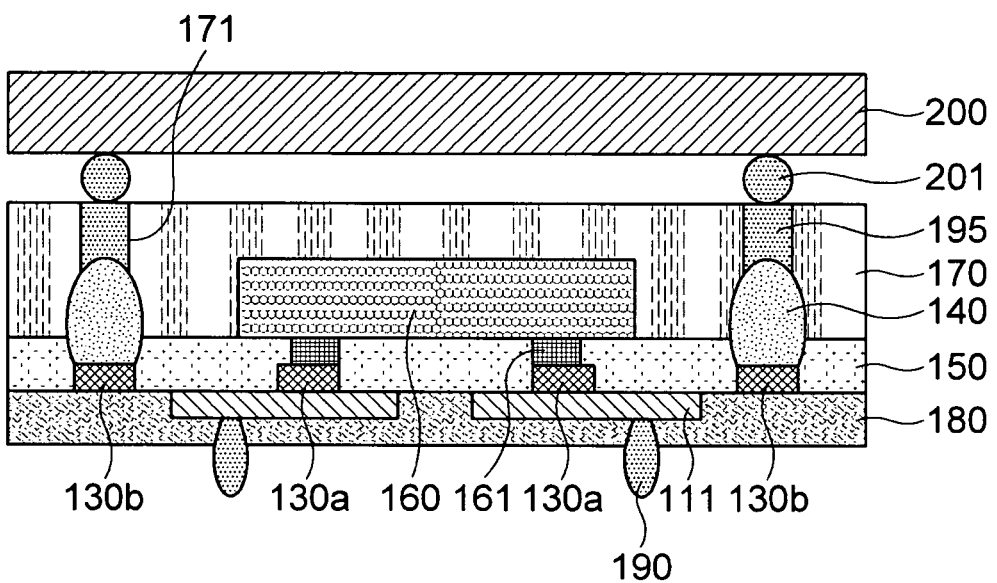

Referring to FIG. 19, the electronic component 200, which is electrically connected to the solder balls 140 exposed by the contact holes 171, is stacked. Here, the electronic component 200 may be an additional semiconductor chip, a module, a package or the like. Here, the additional semiconductor chip may be the same or different kind as the semiconductor chip and is not limited in the embodiment of the present invention. Here, the electronic component 200 and the solder balls 140 are electrically connected to each other by bonding connection members 195 to connection means of the electronic component 200 after filling the contact holes 171 with connection members 195, for example, a plating layer or conductive paste. In addition, although it is not shown in the drawing, a stacked buffer unit may be further formed to surround at least connection portions between the solder balls 140 and the electronic component 200. That is, the stacked buffer unit is interposed between the sealing member 170 and the electronic component 200. Here, the stacked buffer unit can improve reliability of electrical connection by releasing thermal stress of the solder balls 140. Also, the stacked buffer unit can play a role in fixing the electronic component 200 to the sealing member 170.

Therefore, the method of forming the stacked wafer level package in accordance with the embodiment of the present invention can improve a misalignment problem generated in a stacking process by performing a rearrangement wiring layer forming process, a semiconductor chip mounting process and the stacking process after previously bonding the solder balls for interconnection between the stacked components to the conductive layer for forming the rearrangement wiring layer.

Hereinafter, a method of manufacturing a stacked wafer level package in accordance with a fifth embodiment of the present invention will be described in detail with reference to FIGS. 20 and 21. In the fifth embodiment of the present invention, the stacked wafer level package is manufactured by the same method as that of the fourth embodiment except forming a buffer unit. Therefore, the same reference numerals are given to the same elements as those of the fourth embodiment, and repeated descriptions will be omitted.

Figure 20:
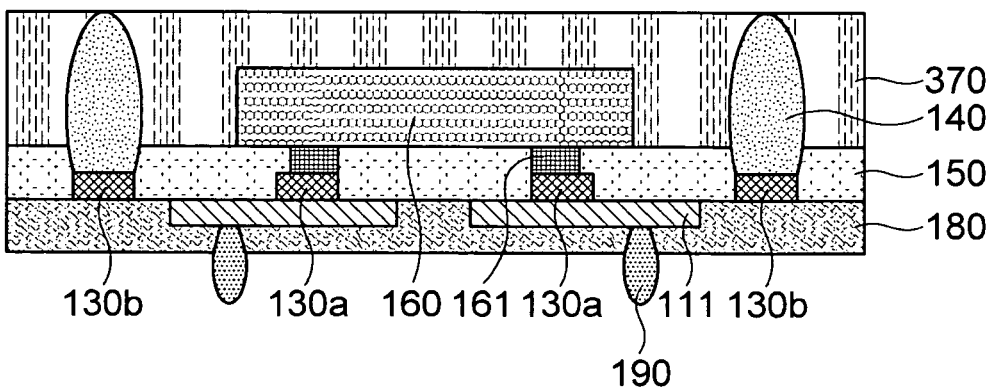
FIGS. 20 and 21 are cross-sectional views illustrating a manufacturing process of a stacked wafer level package in accordance with a fifth embodiment of the present invention.
Figure 21:
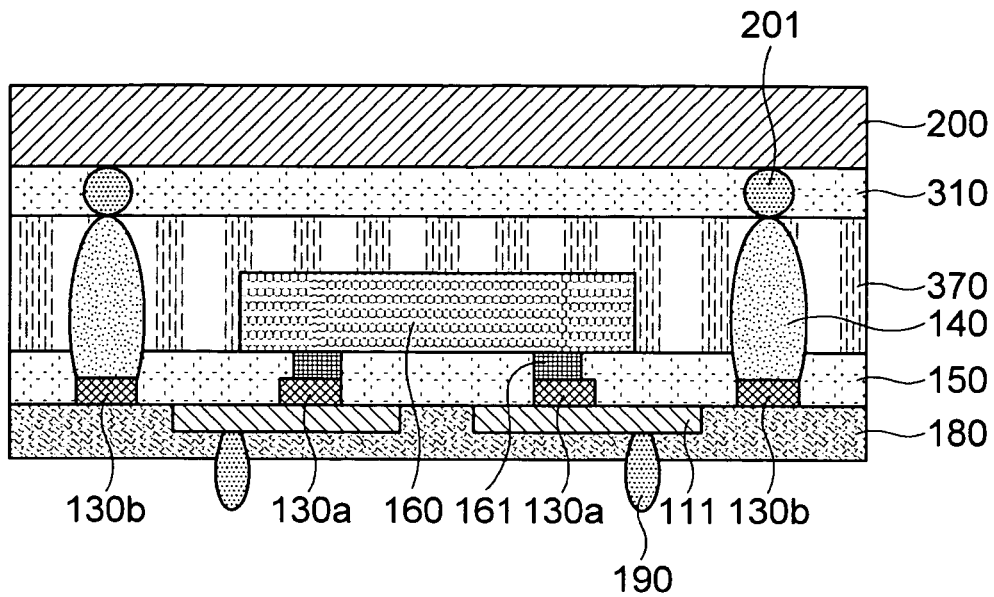

FIGS. 20 and 21 are cross-sectional views illustrating a manufacturing process of the stacked wafer level package in accordance with the fifth embodiment of the present invention.

Referring to FIG. 20, in order to manufacture the stacked wafer level package, first, a substrate 100 is prepared. Then, after forming a conductive layer 110 on the substrate 100, chip connection pads 130*a* and internal connection pads 130*b* are formed on the conductive layer 110. Then, solder balls 140 connected to the internal connection pads 130*b* are formed, and a semiconductor chip 160 is mounted to be connected to the chip connection pads 130*a*. Then, a sealing member 370 is formed to seal the solder balls 140 and the semiconductor chip 160.

Here, the sealing member 370 is formed to expose the solder balls 140. That is, the sealing member 370 has a height equal to or lower than that of the solder balls 140.

Then, after separating the substrate 100 from the conductive layer 110, a rearrangement wiring layer 111 is formed by etching the conductive layer 110. Then, after forming an insulating pattern 180 to expose portions of the rearrangement wiring layer 111, external connection means 190 are formed on the exposed rearrangement wiring layer 111.

Referring to FIG. 21, an electronic component 200, which is electrically connected to the solder balls 140, is stacked on the sealing member 370. Here, since the solder balls 140 are not exposed through separate contact holes and have a height equal to or higher than that of the sealing member 370, the solder balls 140 and connection terminals 201 of the electronic component 200 can be directly in contact with each other without filling separate connection members.

A stacked buffer unit 310 may be further formed to cover connection portions between the solder balls 140 and the electronic component 200. The stacked buffer unit 310 may be formed by filling under-fill material between the sealing member 370 and the electronic component 200. The under-fill material may include epoxy resin, polyimide resin, polyacrylate resin, polyester resin, polybenzoxazole resin or the like.

The stacked buffer unit 310 can improve fatigue life of the solder balls 140 by releasing thermal stress applied to the solder balls 140. Accordingly, reliability of electrical contact between the solder balls 140 and the electronic component 200 can be improved. Also, the electronic component 200 can be fixed to the sealing member 370 by the stacked buffer unit 310.

Although it is shown that the electronic component 200 is stacked by being directly bonded to the solder balls 140, it is not limited thereto, and ACF and NCP can be used.

Therefore, in the embodiment of the present invention, when forming the sealing member, since the sealing member is formed to expose the solder balls, there is no necessity of separately performing a process of forming contact holes in the sealing member to expose the solder balls, thereby simplifying processes.

Hereinafter, a method of manufacturing a stacked wafer level package in accordance with a sixth embodiment of the present invention will be described in detail with reference to FIGS. 22 and 37. In the sixth embodiment of the present invention, the stacked wafer level package is manufactured by the same method as that of the fourth embodiment except forming a buffer unit. Therefore, the same reference numerals are given to the same elements as those of the fourth embodiment, and repeated descriptions will be omitted.

Figure 22:
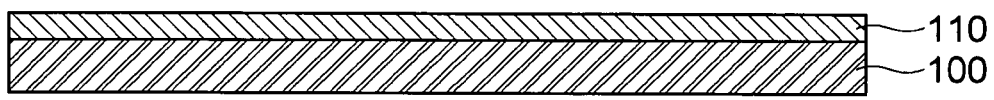
FIGS. 22 to 37 are cross-sectional views illustrating a manufacturing process of a stacked wafer level package in accordance with a sixth embodiment of the present invention.
Figure 37:
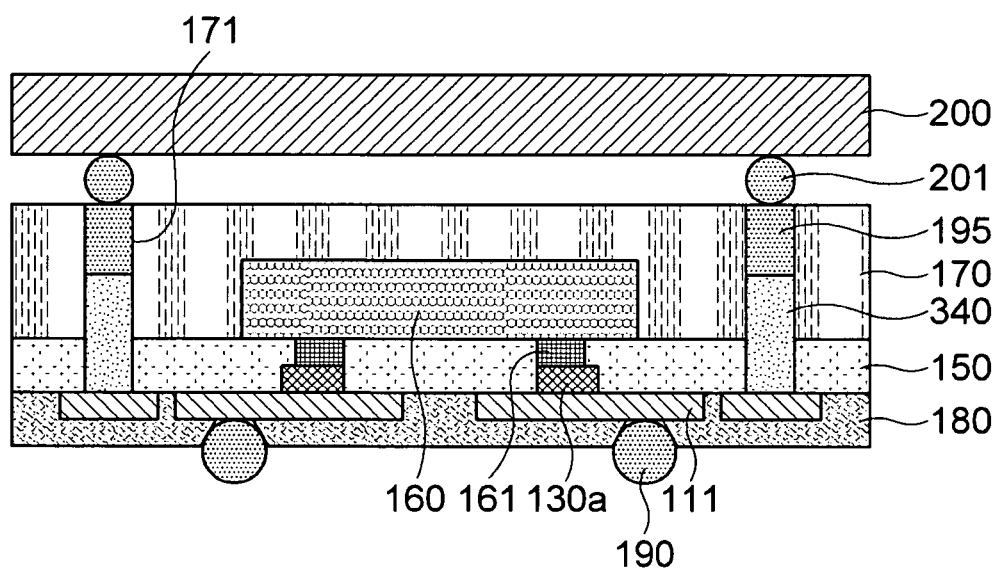

FIGS. 22 and 37 are cross-sectional views illustrating a manufacturing process of the stacked wafer level package in accordance with the sixth embodiment of the present invention.

FIGS. 22 to 37 are cross-sectional views illustrating a manufacturing process of the stacked wafer level package in accordance with the second embodiment of the present invention.

Referring to FIG. 22, in order to manufacture the stacked wafer level package, first, a substrate 100 is prepared.

The substrate 100 may be a wafer substrate used in a semiconductor process. The substrate 100 may be made of silicon, ceramic, glass, polymer or the like.

A conductive layer 110 is formed on the substrate 100. Here, the conductive layer 110 can be formed by laminating a metal foil. In the embodiment of the present invention, a method of forming the conductive layer 110 is not limited, and the conductive layer 110 can be formed by other methods such as by laminating metal. Also, the metal may be Cu, Au, W, Ni, Pb, Ti or the like. The conductive layer 110 may be formed of a film of a single kind or stacked films of two or more kinds.

Figure 23:
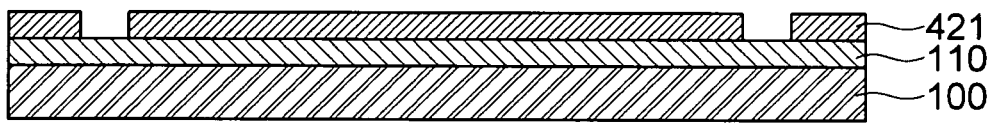

Referring to FIG. 23, after forming the conductive layer 110, a first resist pattern 421 is formed on the conductive layer 110. In order to form the first resist pattern 421, first, a resist layer is formed by coating photosensitive resin or laminating DFR on the conductive layer 110. Then, the first resist pattern 421 is formed by performing exposure and development processes on the resist layer.

Figure 24:
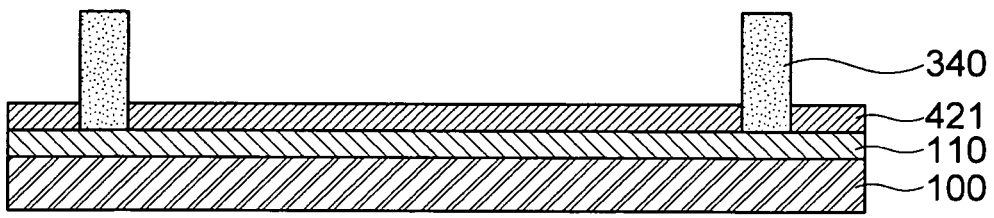

Referring to FIG. 24, metal post 340 as internal connection means are formed on the conductive layer 110 exposed by the first resist pattern 421. The metal posts 340 may be formed by a metal plating method.

Then, after forming the metal posts 340, the first resist pattern 421 is removed.

Figure 25:
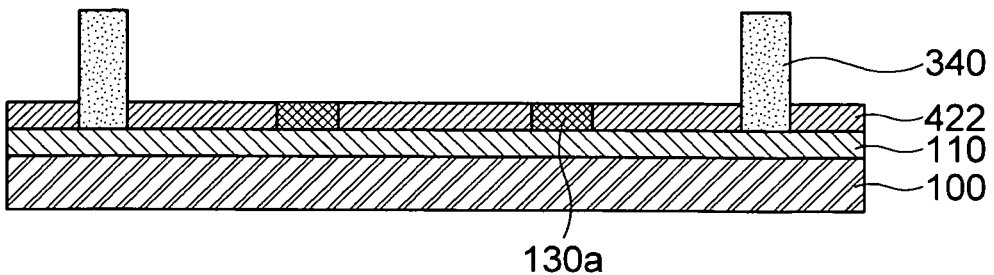

Referring to FIG. 25, a second resist pattern 422 is formed on the substrate 100 on which the metal posts 340 are formed. Chip connection pads 130a are formed on the conductive layer 110 exposed by the second resist pattern 422 by using the second resist pattern 422 as a mask.

The chip connection pads 130a can be formed by a deposition process using a shadow mask. Or, the chip connection pads 130a can be formed by electroplating using the conductive layer 110 as a seed layer.

The chip connection pads 130a may be made of metal, for example, one or two or more of Al, Cu, Ni, and Tl.

Figure 26:
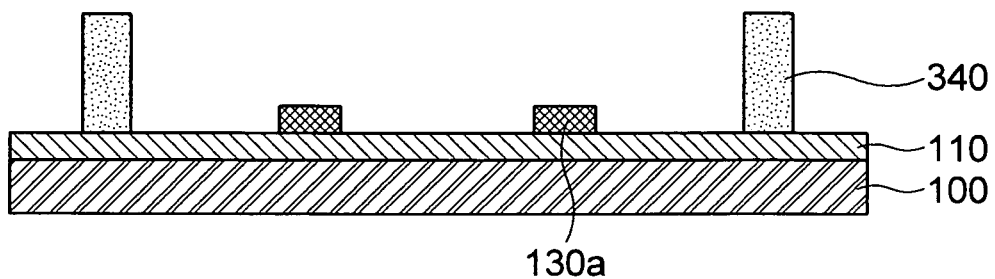

The second resist pattern 422 is removed as shown in FIG. 26.

Figure 27:
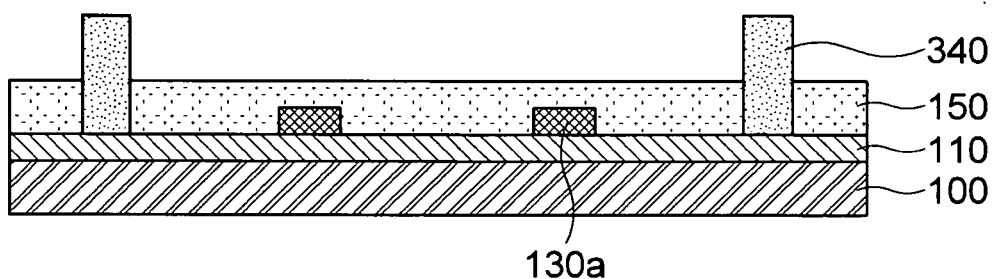

Referring to FIG. 27, a mounting means 150 such as ACF, liquid NCP or the like is formed on the conductive layer 110 including the chip connection pads 130a.

Figure 28:
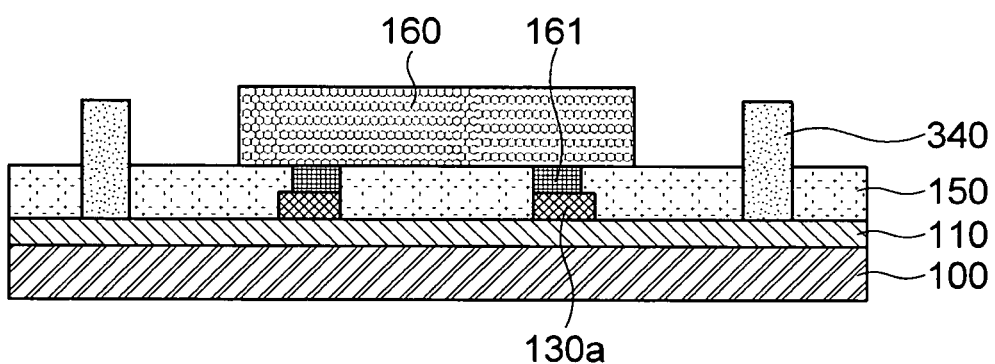

Referring to FIG. 28, as a semiconductor chip 160 is pressed onto the mounting means 150, connection terminals 161 of the semiconductor chip 160 can be electrically connected to the chip connection pads 130a. Here, in case that the mounting means 150 is ACF, the connection terminals 161 of the semiconductor chip 160 and the chip connection pads 130a can be electrically connected to each other by the ACF. Also, in case that the mounting means 150 is NCP, the mounting means 150 bonds and fixes the semiconductor chip 160 to the conductive layer 110 by being disposed around the connection terminals 161 of the semiconductor chip 160 and the chip connection pads 130a, which are in contact with each other, without being interposed between the connection terminals 161 of the semiconductor chip 160 and the chip connection pads 130a. At this time, the NCP plays a role of a buffer unit to improve reliability of electrical contact between the semiconductor chip 160 and the conductive layer 110.

The semiconductor chip 160 and the chip connection pads 130a can be electrically connected to each other by using soldering or conductive paste as the mounting means 150. Here, in case that the semiconductor chip 160 and the chip connection pads 130 are electrically connected to each other by soldering, although it is not shown in the drawing, a buffer unit may be formed to cover connection portions between the semiconductor chip 160 and the chip connection pads 130a. The buffer unit may be formed by filling under-fill material between the conductive layer 110 and the semiconductor chip 160 after bonding the semiconductor chip 160 to the chip connection pads 130a by soldering.

Figure 29:
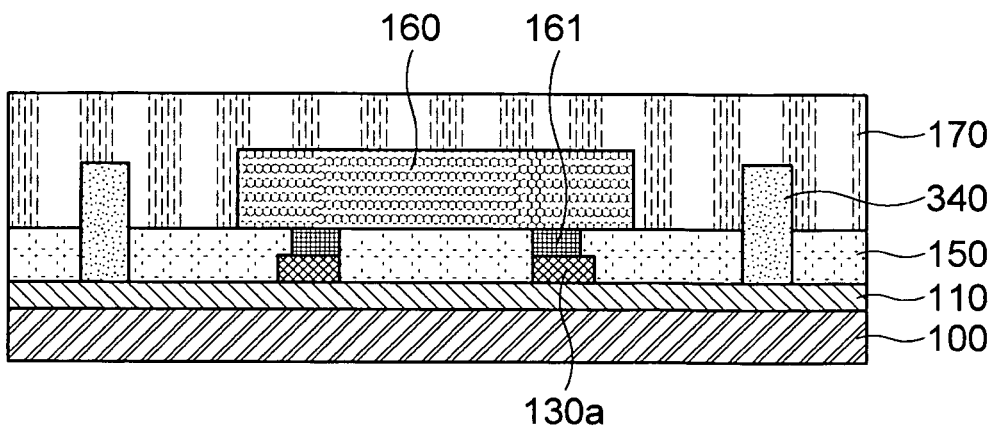

Referring to FIG. 29, after mounting the semiconductor chip 160, a sealing member 170 is formed to seal the semiconductor chip 160. Here, the sealing member 170 may be formed by a method such as transfer molding, injection molding, screen printing, dispensing or the like. Also, the sealing member 170 is made of resin such as epoxy resin, silicon resin, fluorine resin, acrylic resin or the like.

Figure 30:
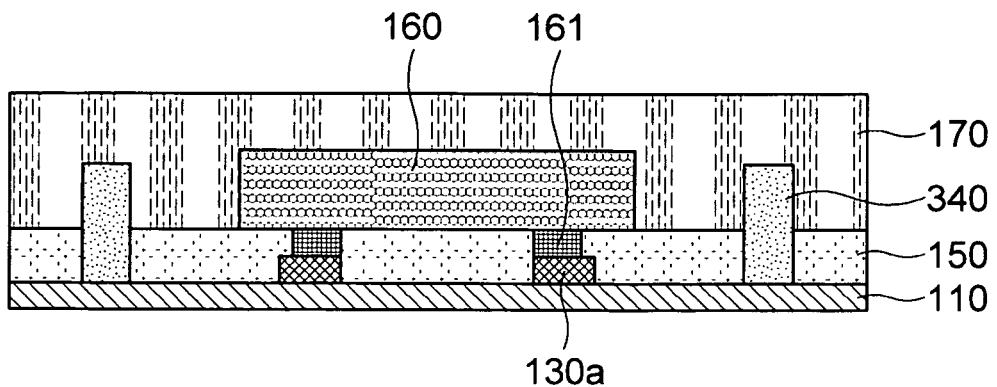

Referring to FIG. 30, after forming the sealing member 170, the substrate 100 is separated from the conductive layer 110. The substrate 100 is separated from the conductive layer 110 by a polishing method or a wet etching method.

Although it is not shown in the drawing, the substrate 100 is separated from the conductive layer 110 by other methods such as by removing a sacrificial layer through a wet etching process or UV irradiation after forming the sacrificial layer between the substrate 100 and the conductive layer 110. At this time, the sacrificial layer is formed on the substrate 100 before forming the conductive layer 110. Here, the sacrificial layer may be made of one of metal, silicon oxide, silicon nitride and UV photodegradable resin.

Figure 31:
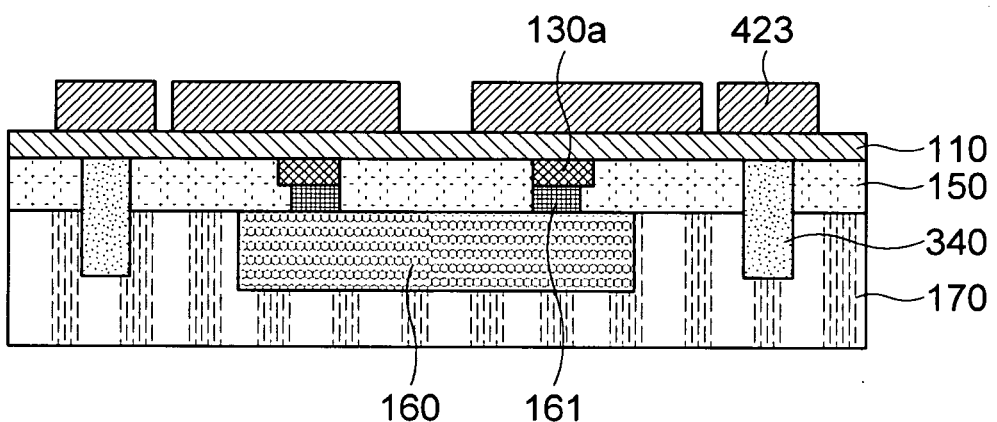

Referring to FIG. 31, a third resist pattern 423 is formed on a bottom of the conductive layer 110 exposed by removing the substrate 100. The third resist pattern 423 forms a resist layer by coating photosensitive resin or laminating DFR on the bottom of the conductive layer 110. Then, the third resist pattern 423 is formed by performing exposure and development processes on the resist layer.

Figure 32:
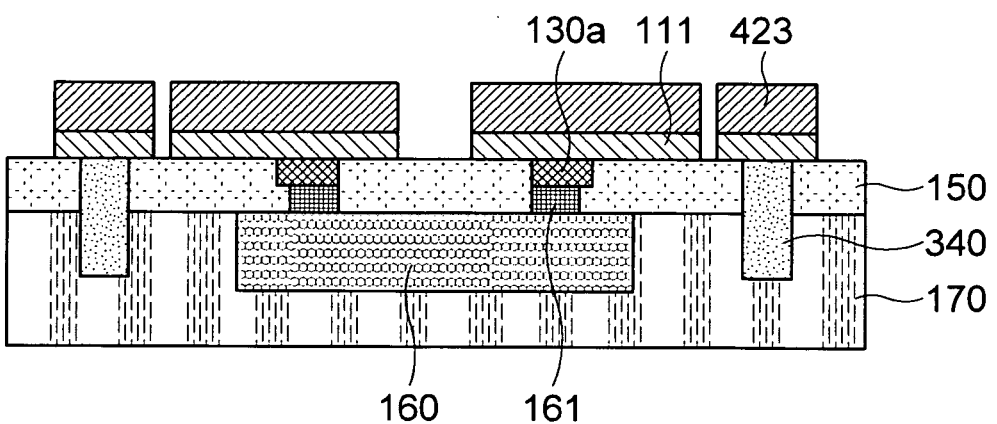
Figure 33:
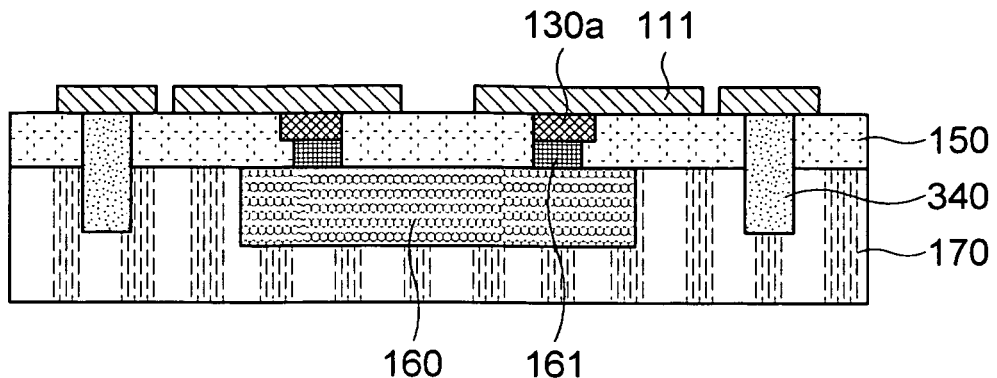

Referring to FIG. 32, a rearrangement wiring layer 111 is formed by etching the conductive layer 110 by using the third resist pattern 423 as an etch mask. Then, as shown in FIG. 33, the third resist pattern 423 is removed.

Therefore, a connection failure between the metal posts 340 and the rearrangement wiring layer 111 can be prevented by performing a rearrangement wiring layer forming process, a semiconductor chip mounting process, a sealing member forming process and so on after previously bonding the metal posts 340 for interconnection with an electronic component 200 described later to the conductive layer 110 before forming the rearrangement wiring layer 111.

Figure 34:
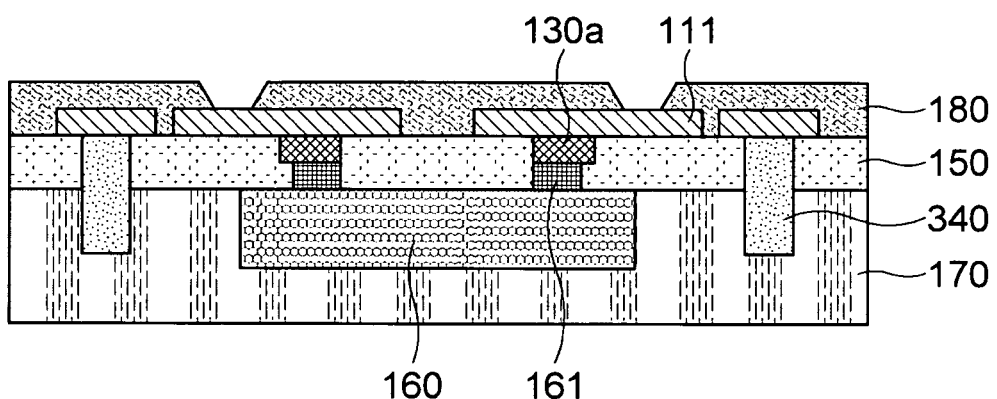

Referring to FIG. 34, an insulating pattern 180 is formed on the rearrangement wiring layer 111. The insulating pattern 180 exposes portions of the rearrangement wiring layer 111. The insulating pattern 180 can be formed by exposure and development processes after forming an insulating layer.

Figure 35:
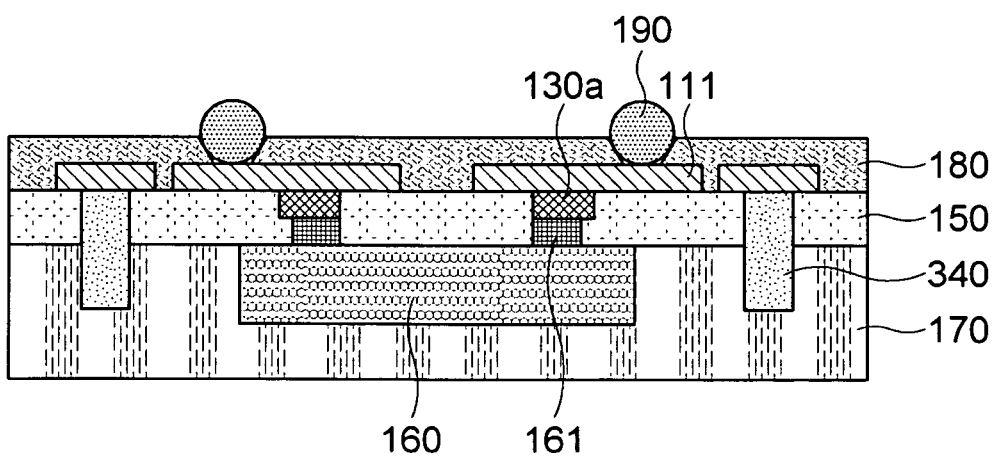

Referring to FIG. 35, external connection means 190 are formed on the rearrangement wiring layer 111 exposed by the insulating pattern 180. Here, the external connection means 190 may be solder balls, metal bumps or the like.

Figure 36:
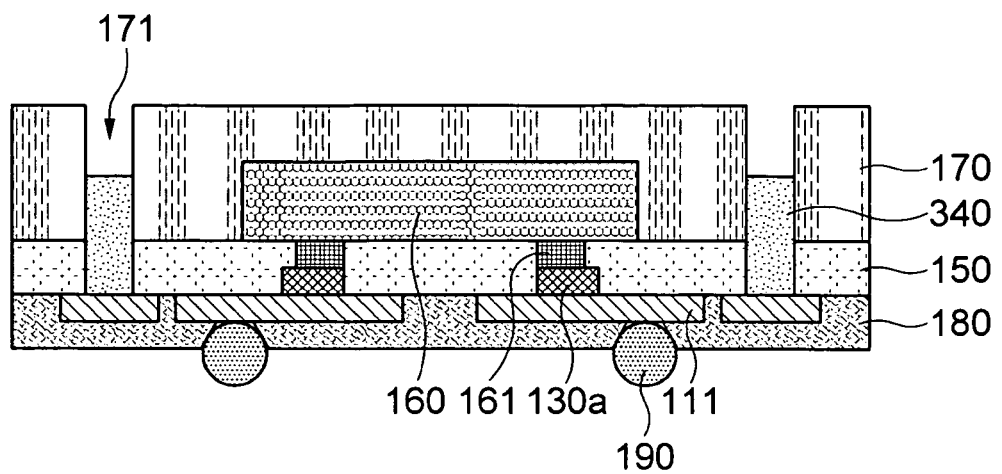

Referring to FIG. 36, contact holes 171 are formed in the sealing member 170 to expose the metal posts 340. The contact holes 171 may be formed by a method such as mechanical drilling, laser drilling, etching or the like.

Referring to FIG. 37, the electronic component 200, which is electrically connected to the metal posts 340 exposed by the contact holes 171, is stacked. Here, the electronic component 200 and the metal posts 340 are electrically connected to each other by bonding connection members 195 to connection means of the electronic component 200 after filling the contact holes 171 with the connection members 195 such as a plating layer or conductive paste.

In addition, although it is not shown in the drawing, a stacked buffer unit may be further formed to surround at least connection portions between the metal posts 340 and the electronic component 200. That is, the stacked buffer unit is interposed between the sealing member 170 and the electronic component 200.

Therefore, the method of forming the stacked wafer level package in accordance with the embodiment of the present invention can improve a misalignment problem generated in a stacking process by performing a rearrangement wiring forming process, a semiconductor chip mounting process, the stacking process and so on after previously bonding the metal posts for interconnection between the stacked components to the conductive layer for forming the rearrangement wiring layer.

In the embodiment of the present invention, although the metal posts are exposed by forming the contact holes in the sealing member, it is not limited thereto. For example, the sealing member can be formed to expose the metal posts by being formed at a height equal to or lower than that of the metal posts. That is, when forming the sealing member, since the sealing member is formed to expose the metal posts, there is no necessity of separately performing a process of forming the contact holes to expose the metal posts, thereby simplifying processes.

The stacked wafer level package in accordance of the present invention can prevent a misalignment problem generated in the stacking process by performing the semiconductor chip mounting process, the rearrangement wiring layer forming process, the stacking process and so on after previously bonding the internal connection means for interconnection between the stacked components to the conductive layer, thereby improving the reliability of electrical contact between the stacked electronic components.

Also, the stacked wafer level package can reduce manufacturing time and cost by performing both a stacking process and a packaging process of the chip on the wafer substrate.

Also, the stacked wafer level package can simplify processes by stacking the electronic component while easily performing interconnection through the internal connection means, that is, the solder balls or the metal posts.

Also, the stacked wafer level package can realize a fine pitch by performing the interconnection between the stacked electronic components through the metal posts.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A stacked wafer level package comprising:
a rearrangement wiring layer;
an external connector disposed on a bottom of the rearrangement wiring layer and electrically connected to the rearrangement wiring layer;
a chip connector and an internal connector disposed above the rearrangement wiring layer and electrically connected to the rearrangement wiring layer;
a semiconductor chip mounted on the rearrangement wiring layer and electrically connected to the chip connector by a connection terminal;
a mounting layer connecting the semiconductor chip mounted on the rearrangement wiring layer and the internal connector;
a solder ball, a bottom part of the solder ball being electrically connected to the internal connector;
a sealing member to seal the semiconductor chip and the solder ball and having a contact hole to expose upper portions of the solder ball;
a metal post filled in the contact hole through the sealing member, a bottom part of the metal post being electrically connected to an upper part of the solder ball, the metal post being made of conductive material; and
an electronic component stacked on the sealing member and electrically connected to the metal post.

2. The stacked wafer level package according to claim 1, wherein the internal connector includes internal connection pads.

3. The stacked wafer level package according to claim 1, wherein the electronic component has a shape of one of a semiconductor chip, a module, and a package.

4. The stacked wafer level package according to claim 1, wherein the external connector is one of metal bumps and solder balls.

5. The stacked wafer level package according to claim 1, wherein the mounting layer is one of soldering, conductive paste, non-conductive paste (NCN), and anisotropic conductive film (ACF).

* * * * *